(12) United States Patent
Cox et al.

(10) Patent No.: US 7,626,884 B2
(45) Date of Patent: Dec. 1, 2009

(54) OPTIMIZING MODE REGISTER SET COMMANDS

(75) Inventors: Christopher Cox, Placerville, CA (US); Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 11/978,811

(22) Filed: Oct. 30, 2007

(65) Prior Publication Data

US 2009/0109771 A1    Apr. 30, 2009

(51) Int. Cl.
*G11C 8/00*    (2006.01)
(52) U.S. Cl. ............... 365/233.1; 365/191; 365/193; 710/305
(58) Field of Classification Search .......... 365/233.1, 365/191, 193; 710/305
See application file for complete search history.

(56) References Cited

U.S. PATENT DOCUMENTS

| 5,905,690 | A | * | 5/1999 | Sakurai et al. | ............ 365/233.1 |
| 6,385,127 | B1 | * | 5/2002 | Ikeda | ............ 365/233.1 |
| 7,188,208 | B2 | | 3/2007 | David et al. | ............ 710/305 |
| 2006/0133188 | A1 | * | 6/2006 | Ha et al. | ............ 365/233 |

* cited by examiner

*Primary Examiner*—Anh Phung
*Assistant Examiner*—Eric Wendler
(74) *Attorney, Agent, or Firm*—Trop, Pruner & Hu, P.C.

(57) ABSTRACT

In one embodiment, the present invention includes a method for generating a mode register set (MRS) decoded signal to identify presence of a MRS command in the register device of a registered DIMM memory, delaying the MRS decoded signal for a predetermined delay and disabling address inversion using the delayed MRS decoded signal, switching from a first command timing frequency to a second command timing frequency for a predetermined number of clock cycles, performing a MRS command to a mode register of the DRAM device, and switching back to the first command timing frequency.

14 Claims, 3 Drawing Sheets

3T Timing Enabled

US 7,626,884 B2

OPTIMIZING MODE REGISTER SET COMMANDS

BACKGROUND

Modern computer systems include a variety of components that communication with each other. For example, a processor communicates with a memory such as a registered dual inline memory module (DIMM) including a register device having configuration registers and multiple DRAM devices each including mode registers, via a memory controller. For a registered DIMM, all commands must pass through the register device on the DIMM, before going to the DRAM devices. Oftentimes, commands are sent to the DRAM from the processor through the memory controller. Such commands may be to write and read data. Additional commands are used to control various operation modes of the DRAM devices. Such commands are referred to as mode register set (MRS) commands. During operation, numerous such commands may be sent to a memory to control various modes, initiate status updates and to perform other operations.

Typically, to program a mode register in a DRAM device, a user must ensure that the register device has address inversion disabled and is in a slow timing mode. In contrast, during normal memory operations, the register device generally operates with a faster timing and with address inversion enabled, as these modes improve performance and reduce power consumption. To initiate such changes, a relatively long time is needed for the memory controller to pause normal operation, perform register configuration cycles, send the MRS commands, then again perform register configuration cycles, and then finally resume normal operation.

As described above, when programming MRS commands, address inversion has to be turned off (which is the single largest contributor to controlling simultaneous switching outputs (SSO) and its power impacts). The longer the system has address inversion turned off, the harder it is to optimize the power delivery system to take advantage of such inversion.

DETAILED DESCRIPTION

Embodiments of the present invention may be present in a register device of a memory and memory controller logic. Embodiments allow for the register to identify dynamic random access memory (DRAM) mode register set (MRS) commands received on a memory control bus and targeted to a configuration register of the DRAM devices, and pass them through with automatic switching of command timings and address inversion modes. In one embodiment, the register device of a DIMM (also referred to herein as a "register") is configured with a configuration cycle. The state of the register device is stored in its configuration registers (RC0 to RC15). In turn, the register device communicates with multiple DRAM devices of the memory, which are configured with an MRS command. The state of each DRAM device is stored in its mode registers (MR0 to MR3).

The register will qualify MRS commands by various enable signals, for example, the input clock enable (CKE#), row address strobe (RAS#), column address strobe (CAS#), write enable (WE#) and appropriate chip select (CS#) signals. When the MRS command is identified, the register device (which in double date rate 3 (DDR3) has the ability to fully decode the command, address, control (CMD/ADD/CNTL) bus) will automatically switch into 3T timing mode, meaning that a new command can be issued every three clocks: the first clock is where the address is setup to provide additional setup time; the second clock is where the chip select signal is asserted; and the third clock where the address is being held to provide additional hold time. Note that the address does not need the full additional clock of setup, or the full additional clock of hold, only a portion (e.g., a fraction of a nanosecond) is sufficient to overcome the SSO delay variation that occurs when the second address bus inversion is shut off. Then address inversion is disabled for two clocks, during which the MRS command is performed, rather than first needing multiple register configuration (RC) commands, which write to a set of 4 bit registers in the register device, including control of timing (1T/3T) and second address bus inversion to thus perform the timing and address inversion changes, and then get other RC commands revert back to the original settings after performing the MRS command. The register retains the state of which mode it was in prior to this automated MRS pass-though mode so that once the MRS command stream has finished, it can return to its previous state automatically (e.g., 1T timing with address inversion enabled).

Figure 1:
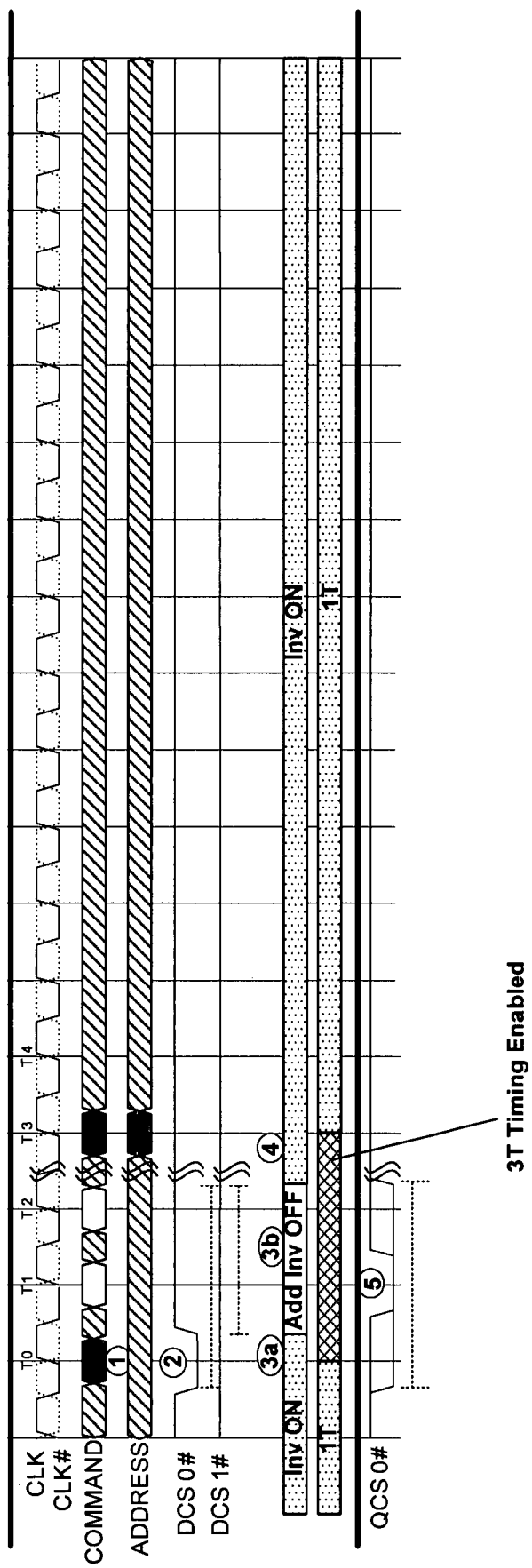
FIG. 1 is a timing diagram of a method in accordance with one embodiment of the present invention.

In various embodiments, to program a mode register the following method, as illustrated in the timing diagram of FIG. 1, may be applied. As shown in FIG. 1, a number of clock periods (i.e., CLK) are present in the timing diagram. A command message, namely an MRS command may be sent, followed by several no operation (NOP) messages. An address bus may be provided with an address of the mode register in the memory to be set. Furthermore, chip select signals (QCS) 0 and 1 may be controlled accordingly, to affect an output of the mode select register as QCS0, which occurs when address inversion is disabled and with a 3T timing in which the command is sent in the second cycle, rather than the first.

Note that the following numbers correspond to those shown in FIG. 1. In the embodiment of FIG. 1, the method may occur as follows: (1) a memory controller sends a MRS command; (2) register decodes MRS command type via CKE#, RAS#, CAS#, WE# and appropriate CS# as valid logic low as per a DDR3 command truth table; (3) device automatically switches to 3T timing for 3 clocks, with address inversion off for 2 clocks; (a) normal propagation delay of register (1 nanosecond (ns)) hides decode time and automated mode switching; (b) addresses can be delayed when switching from inverted to non-inverted, or non-inverted to inverted, but this only happens with the CS# output negated; (4) device returns to its previous state, resuming normal operation; (a) it is possible that the device was previously in 3T timing with address inversion off, and in that case, no mode changes would occur (to determine this, a prior command mode register is read). In this way, as shown at (5), address inversion is actually only off for 2 clock cycles, minimizing a net termination (VTT) current impact. That is, address inversion may be used to reduce the net current, as one address bus balances out the other address bus. In conventional control techniques, it is difficult to control how long the register outputs would stay in the address inversion disabled state, since the program could be running out of slow flash memory, etc. As a result, a VTT supply would need to be sized for this address inversion disabled current. Using an embodiment of the present invention, the time is so short (e.g., 2-3 clocks) that decoupling capacitors on the memory (e.g., a dual in-line memory module (DIMM)) and the baseboard can provide the extra current.

Figure 2:
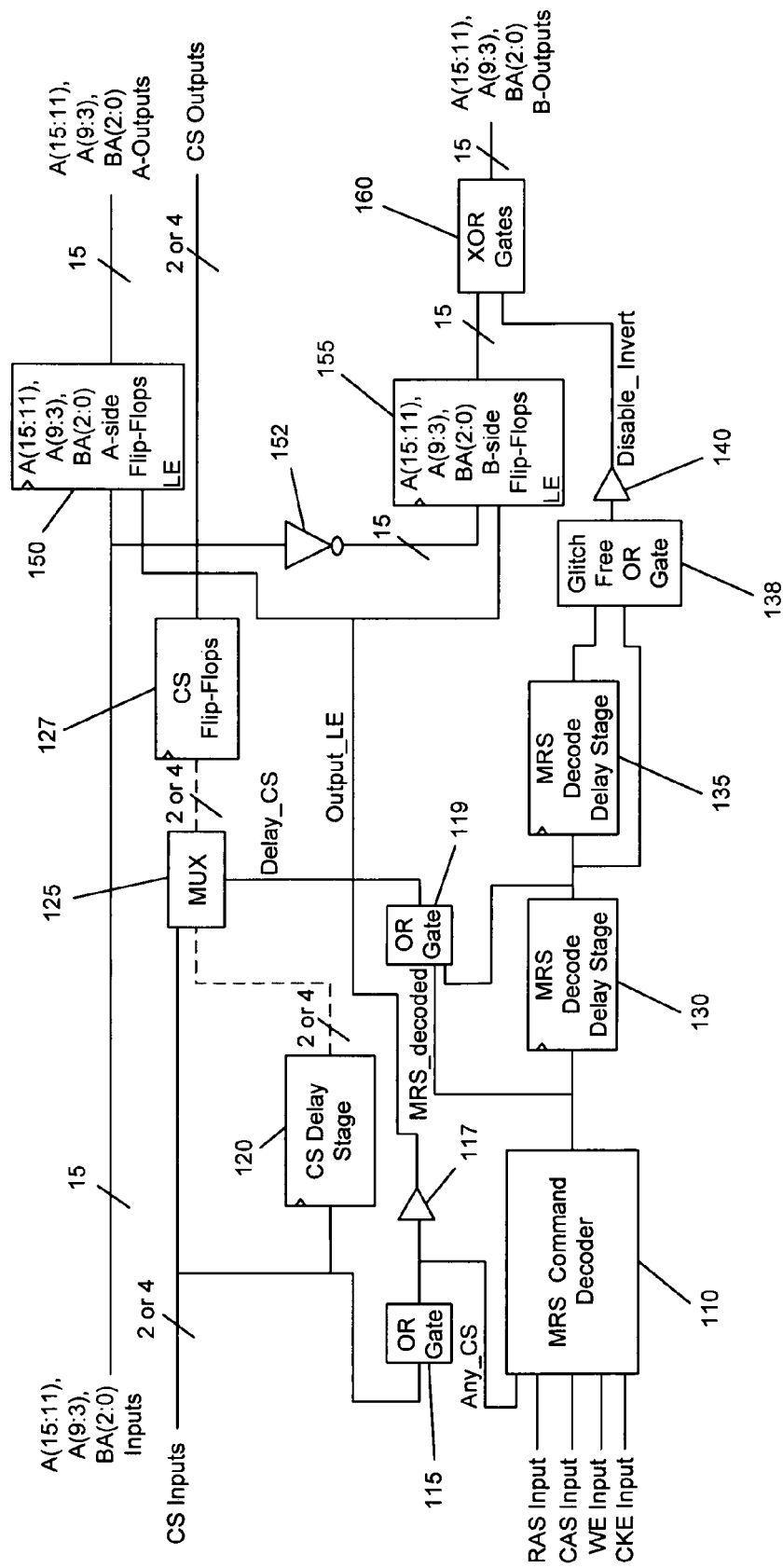
FIG. 2 is a block diagram of a circuit in accordance with one embodiment of the present invention.

Referring now to FIG. 2, shown is a block diagram of a circuit in accordance with one embodiment of the present invention. As shown in FIG. 2, circuit 100, which may be implemented in a register device, may be implemented in a memory such as DIMM, and used to simplify the command sequence to implement MRS commands. As shown in FIG. 2, circuit 100 includes an MRS command decoder 110 coupled to receive various inputs, namely RAS, CAS, WE and CKE input signals. In addition MRS command decoder 110 receives a chip select signal from OR gate 115 if any chip select signal is active. Accordingly, when a valid MRS command is decoded, an MRS_decoded output from MRS command decoder 110 is provided to an OR gate 119 and a first decode delay stage 130, which may be a one-stage flip-flop, which in turn is coupled to a second decode delay stage 135, which may be another flip-flop. The output of delay stage 130 is further coupled to OR gate 119, the output of which is provided to control a multiplexer 125.

Still referring to FIG. 2, second decode delay stage 135 is also coupled to an OR gate 138, along with the output of first delay stage 130. The output of OR gate 138 is coupled to a buffer 140 to generate a Disable_Invert signal, provided to a plurality of exclusive-OR (XOR) gates 160.

Incoming address signals A(15:11) and A(9:3), along with bank address signals BA (2:0) may be provided to both first (A) side flip-flops 150, and second (B) side flip-flops 155 through an inverter 152. These flip-flops may be controlled by an output of buffer 117 coupled to the output of OR gate 115, which provides an Output_LE signal. The chip select inputs are further coupled to a CS delay stage 120, which may be flip-flops to provide an additional one clock delay, and are then provided to multiplexer 125, which is controlled by a Delay_CS signal from OR gate 119. The output of multiplexer 125 is coupled to CS flip-flops 127, which in turn provides the CS outputs, delayed by two clocks.

Thus based on the operation of circuit 100, the A-side outputs of the register are always provided by A-side flip-flops 150, which are always non-inverted. The B-side outputs are provided through flip-flops 155 in an inverted state, but sometimes those outputs are inverted a second time by the XOR gates 160 (i.e., when the output of buffer 140 is asserted), so that the value of the B-side outputs actually matches the value of the A-side outputs for the two clocks. Thus XOR gates 160 may provide non-inverted address outputs during the two clocks for which address inversion is disabled. Circuit 100 may further be associated with additional control logic to perform the automatic command timing frequency change and to perform the incoming MRS command. While shown with this particular implementation in the embodiment of FIG. 2, the scope of the present invention is not limited in this regard.

With the automation described herein, multiple steps can be eliminated (e.g., 34 tCK to 3 tCK reduction to effect a MRS command), resulting in a smaller atomic sequence for controller schedulers. Although the automated switching process will require some additional time (~100 picoseconds (ps) in addition to propagation delay), this can be typically absorbed in a 1 ns delay margin. When not switching between inverted and non-inverted, the propagation delay is only increased by a single exclusive-OR (XOR) gate. In this way, the memory controller no longer has to intelligently control the timing mode or address inversion mode for MRS commands (streamlined operation), and it also allows for power delivery design to still try to optimize for minimal SSO impact (typically achieved with address inversion) and greatly simplifies intensive "dynamic" or "on-the-fly" MRS commands (which may be commonly used with on-die thermal sensors).

In order to read the thermal sensor register information on a DRAM, multiple MRS commands are issued and repeated for every rank in the system. These thermal sensor commands may typically be issued at least 8 times per second. A typical thermal sensor read process by itself takes 18 tCK, add on the 30 tck overhead to perform command mode changes and an impact of 960 ns every second in a 800 megahertz (MHz) system would result, instead of the typical 360 ns. According to various embodiments, a minimum of approximately double time savings may be realized and which dramatically improves if only doing a single MRS command as shown in the timing diagram of FIG. 1. In that scenario, as discussed above, almost a 10 times savings can be realized. Other implementations may be used for controlling a delay lock loop (DLL), namely a "DLL Control for Precharge Powerdown" mode, to be either fast exit (DLL on) or slow exit (DLL off).

Embodiments thus simplify the command sequence needed for MRS commands (which may enable power saving frequency changes and DRAM thermal sensor reads), making it easier on a processor arbiter as well as reducing the SSO delay and VTT current impacts to a system. Embodiments thus simplify MRS command mode programming by automatically changing the register output timing to 3T and disabling the address inversion, whenever the MRS command is detected.

Figure 3:
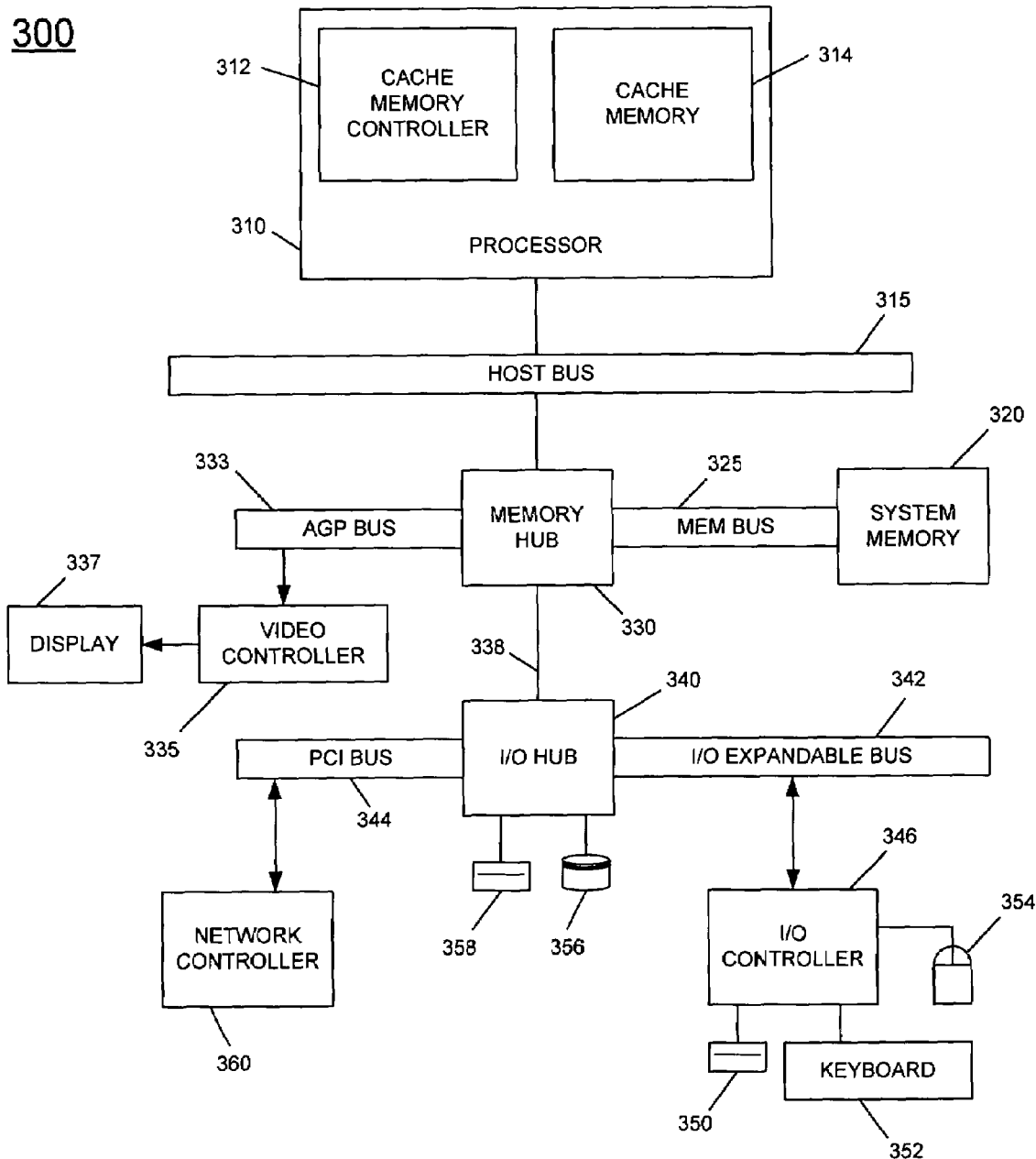
FIG. 3 is a block diagram of a computer system 300 in which embodiments of the invention may be used.

Embodiments may be used in various systems. FIG. 3 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 3, in one embodiment, computer system 300 includes a processor 310, which may include a general-purpose or special-purpose processor such as a microprocessor, microcontroller, a programmable gate array (PGA), and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337. Both memory hub 330 and system memory 320 may be configured to operate in accordance with one embodiment of the present invention. For example memory hub 330 may issue an MRS command, e.g., to read a thermal sensor, and transmit the command to a mode register in system memory 320, which may include logic to automatically change frequency and address inversion modes for execution of the command, and then automatically revert back to the previous settings.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995.

I/O expansion bus 342 may be coupled to an I/O controller 346 that controls access to one or more I/O devices. As shown in FIG. 3, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 3. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
generating a mode register set (MRS) decoded signal to identify presence of a MRS command on a memory command bus targeted towards a mode register of a memory;
delaying a first signal for a predetermined delay and disabling address inversion in a register device using the delayed first signal;
switching from a first command timing frequency to a second command timing frequency for a predetermined number of clock cycles in the register device, wherein the address inversion is disabled for at least a portion of the predetermined number of clock cycles;
performing an MRS command to the mode register in one or more dynamic random access memory (DRAM) devices responsive to the earlier MRS command to the register device, during the predetermined number of clock cycles; and
switching back to the first command timing frequency.

2. The method of claim 1, further comprising decoding a plurality of signals to identify presence of the MRS command, the plurality of signals corresponding to a chip select signal, a row address strobe signal, a column address strobe signal, a write enable signal and a clock enable signal.

3. The method of claim 1, further comprising switching from the first command timing frequency to the second command timing frequency and disabling the address inversion responsive to the first signal and without the receipt of a register configuration command to switch frequency or to perform address inversion disablement.

4. The method of claim 1, wherein the MRS command is to cause the memory to read a thermal sensor associated with a rank of the memory.

5. The method of claim 1, further comprising retaining a previous state of a configuration register before switching from the first command timing frequency to the second command timing frequency.

6. The method of claim 2, wherein the predetermined number of clock cycles is three clock cycles, the address inversion is disabled for two of the three clock cycles, and the chip select signal is delayed by two clock cycles.

7. The method of claim 5, further comprising restoring the previous state after the register configuration change is performed.

8. An apparatus comprising:
a mode register set (MRS) command decoder to generate a first signal to identify presence of a MRS command in a register device of a memory;
at least one delay stage to delay the first signal for a predetermined delay;
a first logic to disable address inversion responsive to the delayed first signal; and
a second logic to switch from a first command timing frequency to a second command timing frequency for a predetermined number of clock cycles responsive to the first signal, wherein the address inversion is disabled for at least a portion of the predetermined number of clock cycles, perform the MRS command to a mode register in one or more dynamic random access memory (DRAM) devices responsive to the MRS command during the predetermined number of clock cycles, and switch back to the first command timing frequency.

9. The apparatus of claim 8, wherein the MRS command decoder is operable to decode a plurality of signals to identify presence of the MRS command, the plurality of signals corresponding to a chip select signal, a row address strobe signal, a column address strobe signal, a write enable signal and a clock enable signal.

10. The apparatus of claim 8, wherein the predetermined number of clock cycles is three clock cycles, the address inversion is disabled for two of the three clock cycles, and the chip select signal is delayed by two clock cycles.

11. The apparatus of claim 8, wherein the second logic is operable to switch from the first command timing frequency to the second command timing frequency and the first logic is operable to disable the address inversion responsive to the first signal, without the receipt of a register configuration command to switch frequency or to disable the address inversion.

12. The apparatus of claim 8, wherein the MRS command is operable to cause the memory to read a thermal sensor associated with a rank of the memory.

13. The method of claim 8, wherein the register device is operable to retain a previous state of the register device before switching from the first command timing frequency to the second command timing frequency.

14. The apparatus of claim 13, wherein the register device is operable to restore the previous state after the register configuration change is performed.

* * * * *